United States Patent [19]
Chang

[11] Patent Number: 5,687,234
[45] Date of Patent: Nov. 11, 1997

[54] MOBILE TELEPHONE CHARGER

[75] Inventor: Chia-Yao Chang, Taipei, Taiwan

[73] Assignee: Holintron Co., Ltd., Tainan, Taiwan

[21] Appl. No.: 615,412

[22] Filed: Mar. 14, 1996

[51] Int. Cl.[6] ................................................. H04M 1/00
[52] U.S. Cl. ............................ 379/454; 379/455; 379/446
[58] Field of Search .................................. 379/455, 428, 379/454, 426, 447, 433, 446, 420; 455/89, 90

[56] References Cited

U.S. PATENT DOCUMENTS 5,490,213  2/1996  Huang ................................. 379/455

Primary Examiner—Jack K. Chiang
Attorney, Agent, or Firm—Bacon & Thomas

[57] ABSTRACT

A mobile telephone charger includes a charger case housing a circuit board, and a plug to be combined with the charger case to use DC source in an automobile for charging. The circuit board has an input terminal for connecting with the plug and an output terminal for connecting with a mobile telephone. If AC source is to be used for charging, a plug from AC source can be directly connected with the input terminal of the charger case.

4 Claims, 6 Drawing Sheets

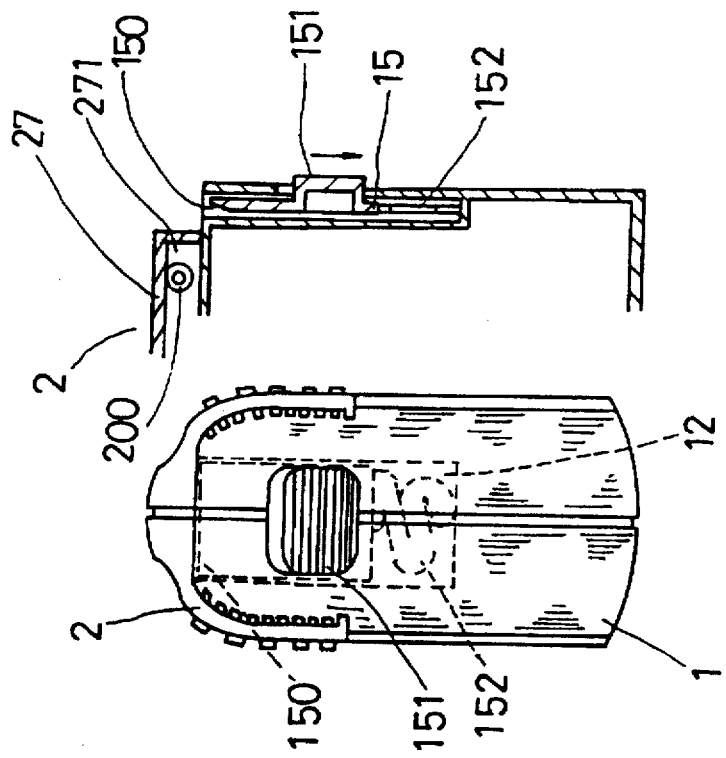
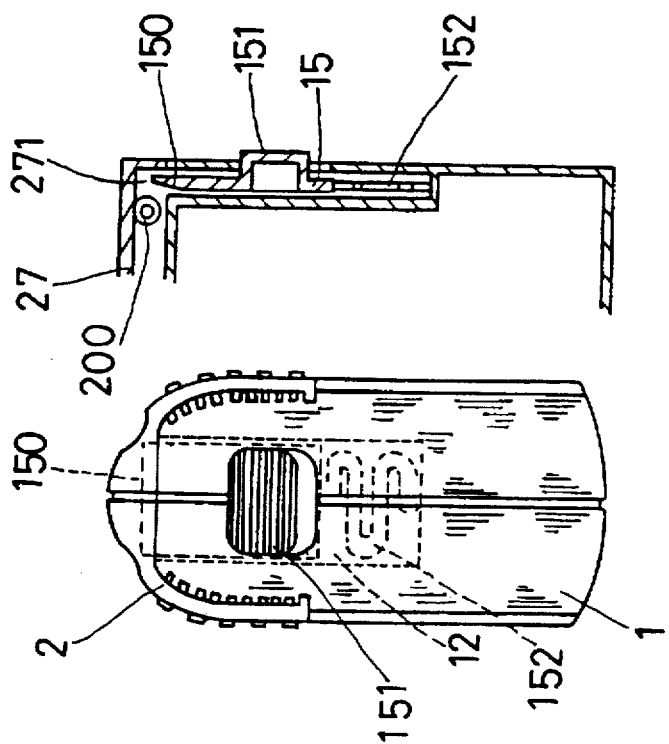
FIG.5    FIG.6    FIG.7    FIG.8

MOBILE TELEPHONE CHARGER

BACKGROUND OF THE INVENTION

This invention concerns a mobile telephone charger, particularly able to be used in charging a mobile telephone with DC source in an automobile or with AC source at any place.

Recently mobile telephones have been used very widely and will become more and more indispensable in our daily life and business for communication. They need batteries for operation, and when the batteries are used up, they must be replaced or recharged. But so far mobile telephone chargers have not been seen in the market.

SUMMARY OF THE INVENTION

The main purpose of the invention is to offer a mobile telephone charger able to utilize DC source in an automobile or AC source of a public utility available at any place, for charging a mobile telephone.

A main feature of the present invent ion is a charger case for charging with AC and a plug able to be combined with the charger case for charging with DC in an automobile. The charger case consists of an upper half case and a lower half case, and a circuit board for the charging operation is deposited in the charger case, and secured in the lower half case. The circuit board has an input terminal to be connected with the plug for charging DC or any socket of AC source for charging AC and an output terminal to be connected with a mobile telephone. The plug has a front tubular portion for conducting function and an oval lid portion having two opposite side edges for combining with the charger case.

BRIEF DESCRIPTION OF DRAWINGS

This invention will be better understood by reference to the accompanying drawings, wherein:

FIG. 5 is an upper view of a preferred embodiment of an elastic plate hook locking the plug combined with the charger case in the mobile telephone charger in the present invention;

FIG. 6 is a side view of FIG. 5;

FIG. 7 is an upper view of the preferred embodiment of the elastic plate hook unlocking the plug from the charger case in the present invention;

FIG. 8 is a side view of FIG. 7; and

DETAILED DESCRIPTION OF THE PREFERRED EMBODIMENT

Figure 1:
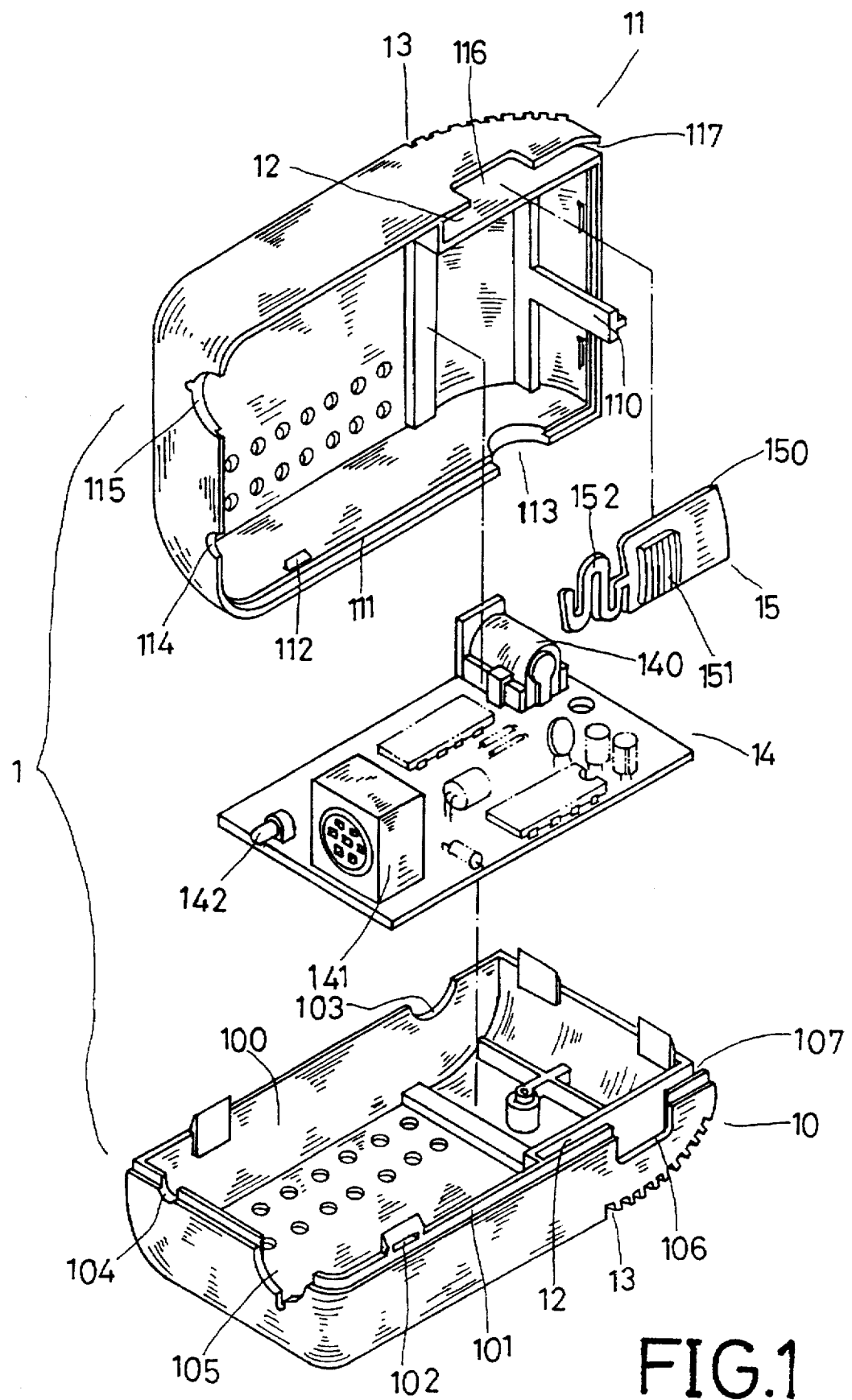
FIG. 1 is an exploded perspective view of a preferred embodiment of a charger case of a mobile telephone charger in the present invention.
Figure 2:
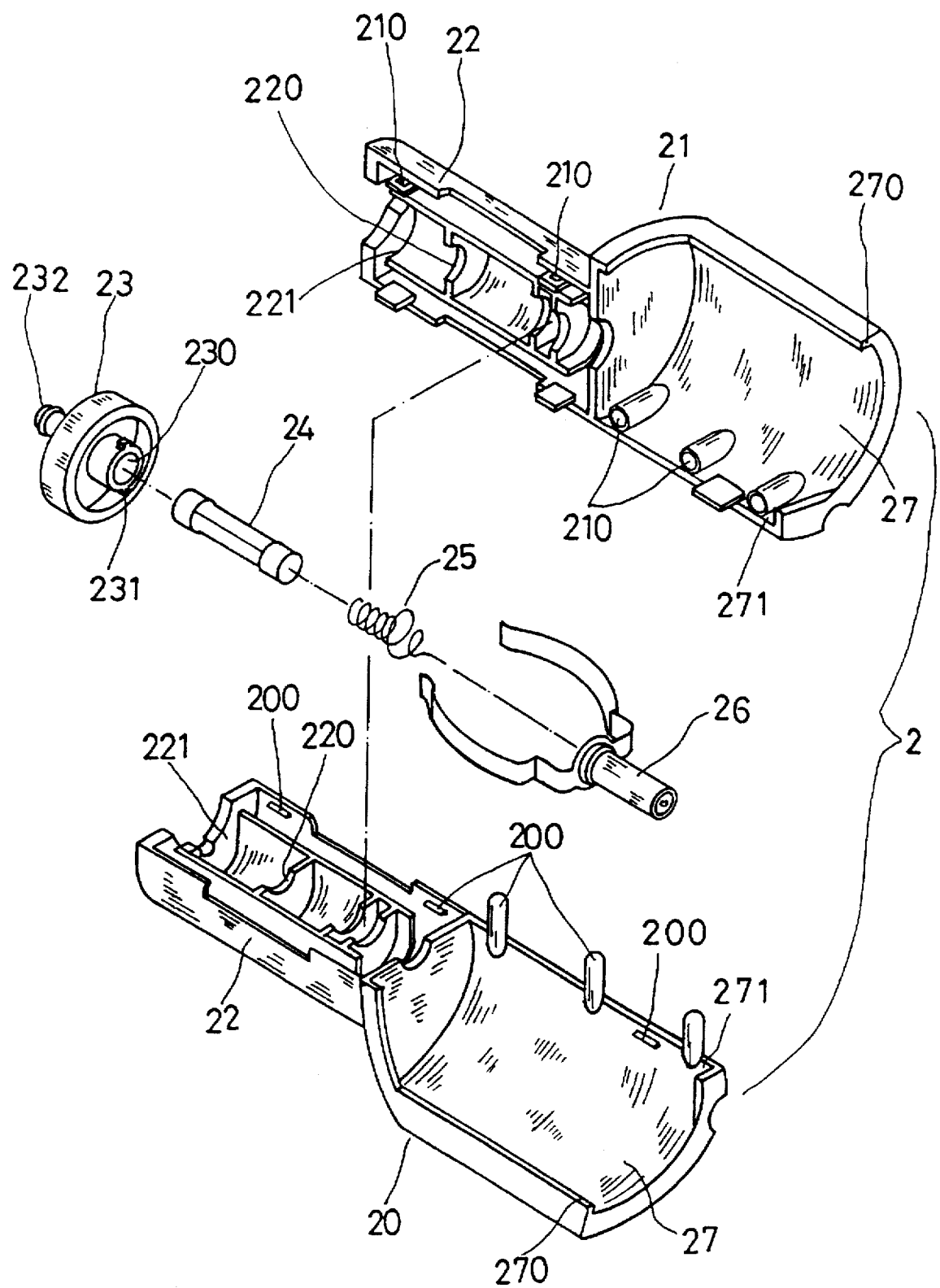
FIG. 2 is an exploded perspective view of the preferred embodiment of a plug of a mobile telephone charger in the present invention.

A preferred embodiment of a mobile telephone charger in the present invention, as shown in FIGS. 1 and 2 and includes a charger case 1 and a plug 2 combined together.

The charger case 1 consists of a lower half case 10 and an upper half case 11. The lower half case 10 is rectangular-shaped, having a large chamber 100, a top edge 101 respectively on four vertical sides, a hook hole 102 formed on the top edge 101 of a first of two opposite long sides, a semicircular notch 103 in the top edge 101 of a second long sides, a small curved notch 104 and a large semicircular notch 105 in the top edge of 101 of a first of two opposite short sides, a square notch 106 in the top edge 101 of the first long side and a notch 107 in the top edge 101 of a second short side near the square notch 106. A long rectangular small chamber 12 is formed at the corner of the first long side and the second short side, communicating with the notch 107. A plurality of parallel lateral slide grooves 13 are provided in the right portion of the bottom surface.

The upper half case 11 is also rectangular-shaped, corresponding to that of the lower half case 10, having a projecting-down upright post 110 near a second of two two opposite short sides, a rectangular notch 116 in the bottom edge of a first of two opposite long sides to face the notch 106 of the lower half case 10, a long groove 111 in a second long side fitting with the top edge 101 of the first long side of the lower half case 10, a hook 112 formed on a bottom edge of a second long side to hook with the hook hole 102 of the lower half case 10, a semicircular notch 113 in the second long side facing to the semicircular notch 103 of the lower half case 10, a small curved notch 114 in a first short side to face the small curved notch 104 of the lower half case 10, a notch 117 in the corner of the first long side and the second short side facing the notch 107 of the lower half case 10. A plurality of parallel lateral slide grooves 13 are provided in the right portion of the upper surface as those 13 provided in the lower half case 10.

Further, a circuit board 14 is provided, being deposited in the large chamber 100 of the lower half case 10, having a plug-style input terminal 146 on one corner facing the notch 103 of the lower half case 10 and the the notch 113 of the upper half case 11, a socket-style output terminal 141 near on another corner facing the notch 105 of the lower half case 10 and the notch 115 of the upper half base 11, and a signal lamp near the output terminal 141 facing the notch 104 of the lower half case 10 and the notch 114 of the upper half case 11.

Further, an elastic plate hook 15 is provided, deposited in the small chamber 12 of the lower and the upper half case 10 and 11, having a long flat portion, and a projecting push surface 151 in an inner section of the long and flat portion, and an upper sloped side edge 150 provided in the long and flat portion, and an elastic means 152 of continuous U-shapes formed to extend rearward from the inner end of the long flat portion.

The plug 2 shown in FIG. 2 is combined with the charger case 1 and plugged in the power source of a lighter in an automobile, with plug 2 having a lower half housing 20 and a an upper half housing 21 combined together by means of projecting small posts 200 spaced apart in a straight line in the lower half housing 20 and holes 210 spaced apart in a straight line in the upper half housing 21. Each half housing 20 and 21 has an outer half tubular portion to form an outer tubular portion 22 of the plug 2 after both the half housings 20 and 21 are combined together, and an inner half portion forming a nearly oval lid 27 with a large opening at the left side, which is defined by two horizontal opposite straight edges 270 to engage and slide in the parallel slide grooves 13 of the lower and the upper half charger case 10 and 11. The oval lid 27 has a groove 271 near a short inner end wall of the oval lid 27. The outer tubular portion 22 has a lengthwise chamber 220 and an engaging groove 221 defined by a front side wall of the chamber 220.

Further, a front cap 23 is provided, combined with the front end of the outer tubular portion 22 of the plug 2, and having a flat round shape and a center hole 230 defined by a short tube projecting rearward, two opposite projections 231.231 formed on the peripheral surface of the short tube to engage the groove 221 of the outer tubular portion 22 of the plug 2, and a metal conductor 232 inserted and extending partially out hole 230.

Further, a fuse 24, a spring conductor 25, and a bar conductor 26 are provided in order and located behind the conductor 232 in the chamber 220 of the outer tubular portion 22.

Figure 3:
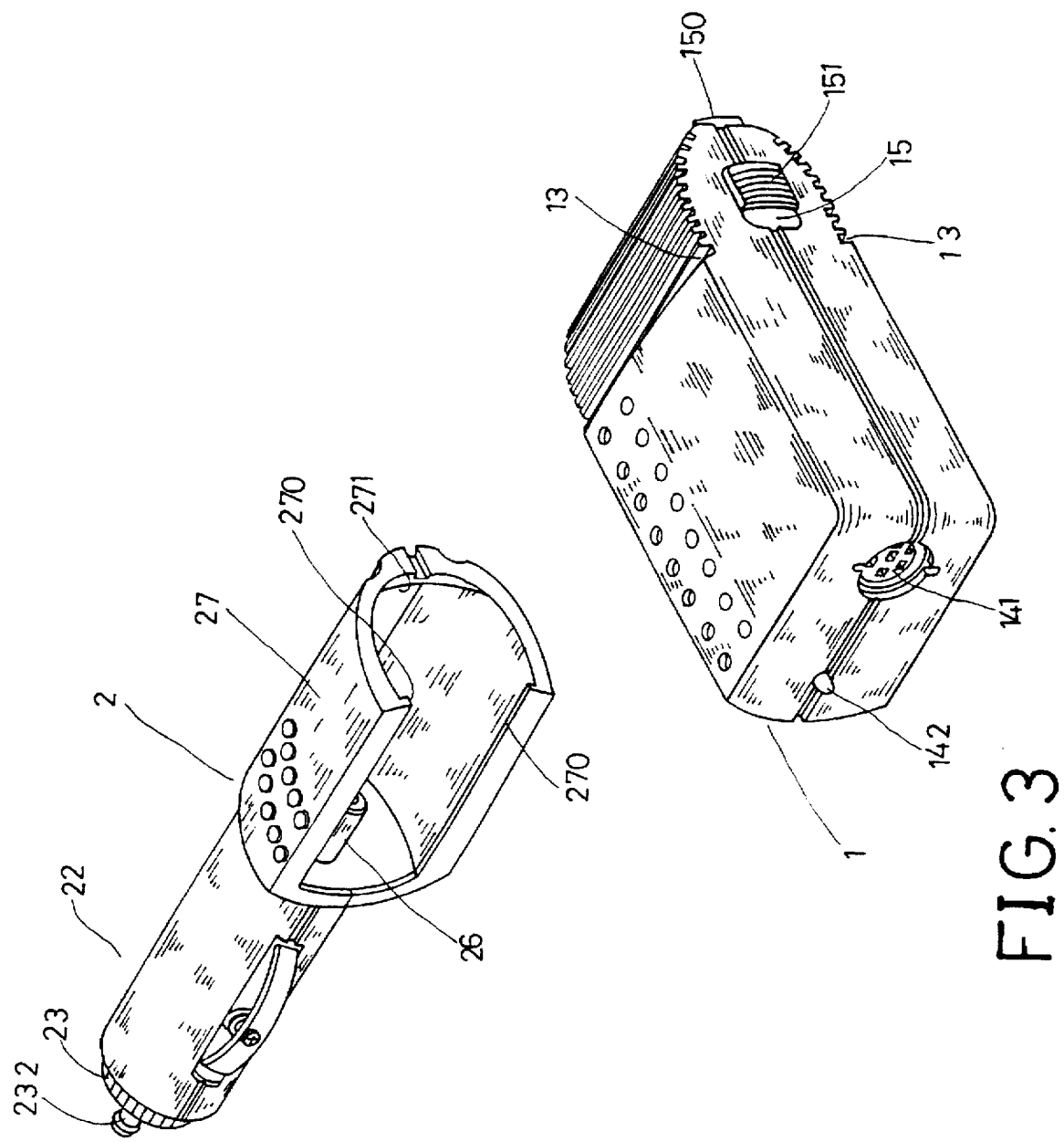
FIG. 3 is a perspective view of the preferred embodiment of a mobile telephone charger in the present invention, showing the charger case separated from the plug.
Figure 4:
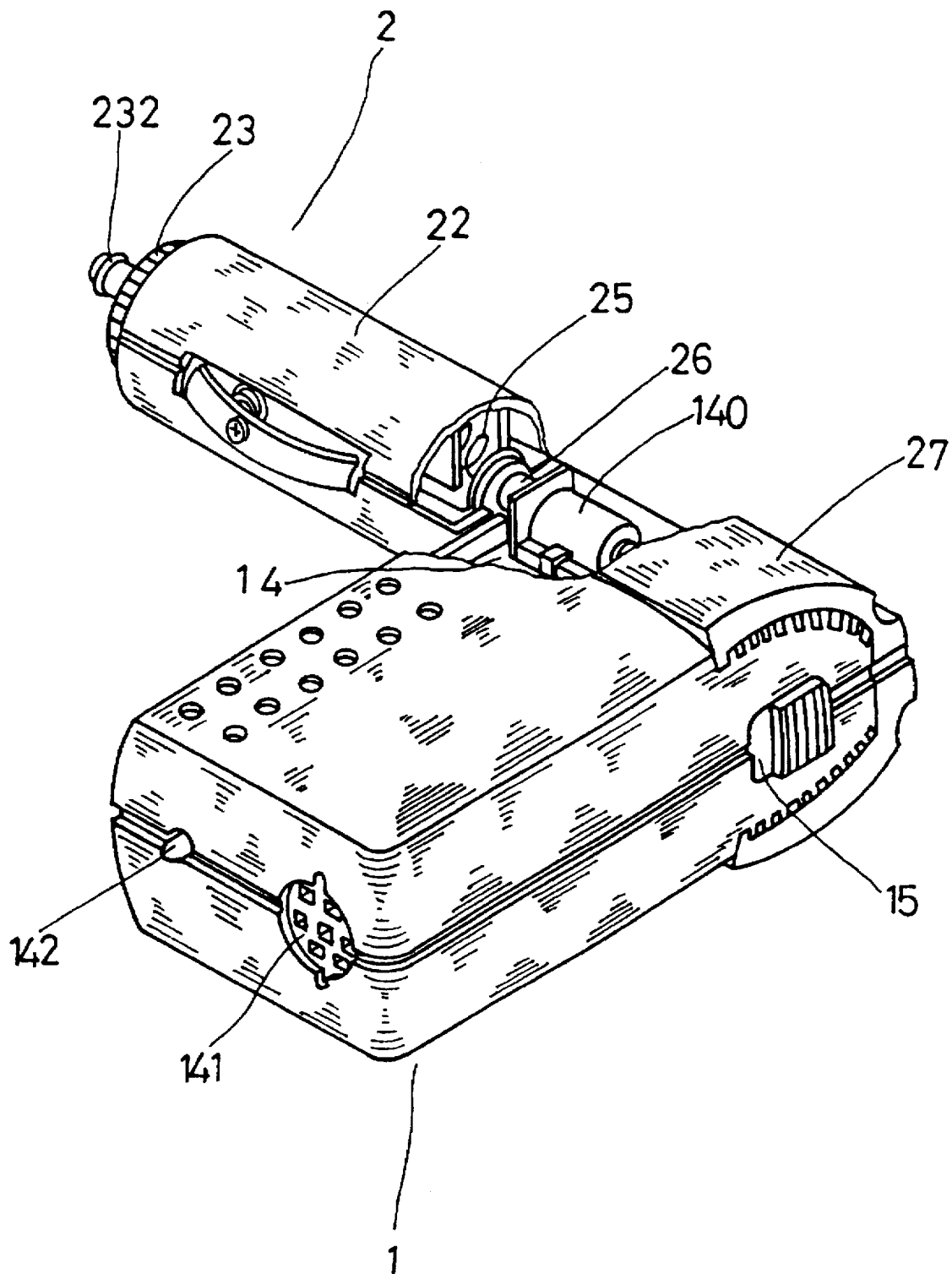
FIG. 4 is a perspective view of the preferred embodiment of a mobile telephone charger in the present invention, showing the charger case combined with the plug together.

In assembling the charger case 1, referring to FIGS. 1 and 3, firstly, the circuit board 14 is fixed in the large chamber 100 of the lower half case 10, with the input terminal 140 and the output terminal 141 respectively located facing the notches 103 and 105. Then the elastic plate hook 15 is placed in the small chamber 12 of the charger case 1, with the push surface 151 and the slope upper edge 150 respectively extending out of the notches 106 and 107 of the lower half case 10, and with the elastic means 152 located in an inner section of the chamber 12. After that, the upper half case 11 is closed just on the lower half case 10 with force, with the groove 111 engaging the upper edge 101, with the hook 112 hooking the hook hole 102, and with the projecting post 110 contacting the circuit board 14 to secure the same stably against loosening.

Next, in assembling the plug 2, referring to FIGS. 2 and 3, firstly the spring conductor 25 and the bar conductor 26 are orderly placed in the chamber 220, and then the two half housings 20, 21 are put together with force, with the small posts 200 engaging the holes 210. Next, the front end of the fuse 24 is placed in the hole 230 of the front cap 23 to contact with the conductor 232 and the front cap 23 is deposited in the chamber 220. When the spring conductor 25 is pushed by the fuse 24 together with the front cap 23 with force, the projections 231, 231 extend in the chamber 220. Then the cap 23 is rotated to let the projections 231, 231 move along the engage groove 221 to stop therein, permitting the spring conductor 25 to elastically push the fuse 24 and the cap 23 at the same time, thus securing the cap 23 in the chamber 220. Then the conductor 232, the fuse 24, the spring conductor 25 and the bar conductor 26 form a current passage by mutual contact.

When this invention is used in an automobile, referring to FIGS. 3, 4, 5 and 6, the oval lid 27 of the plug 2 is pushed to let the two opposite slide edges 270, 270 fit and move slidingly in a pair of the slide grooves 13 of the charger case 1 until the bar conductor 26 extending out of the chamber 220 inserts in the input terminal 140 of the circuit board 14 and the sloped edge 150 of the elastic plate hook 15 extends in the groove 271 of the oval lid of the plug 2, completing combination of the plug 2 with the charger case 1. Then the plug 2 is secured by means of the sloped edge 150 of the elastic plate hook 15, and is thus unable to separate from the charger case 2. Now, the plug of a mobile telephone can be inserted in the output terminal 141 of the circuit board 14 in the charger case 1, with the conductor 232 of the plug 2 inserted in the socket of a lighter in an the automobile for charging the mobile telephone. And the signal lamp 142 lights up to show that the charging operation is proceeding.

Figure 9:
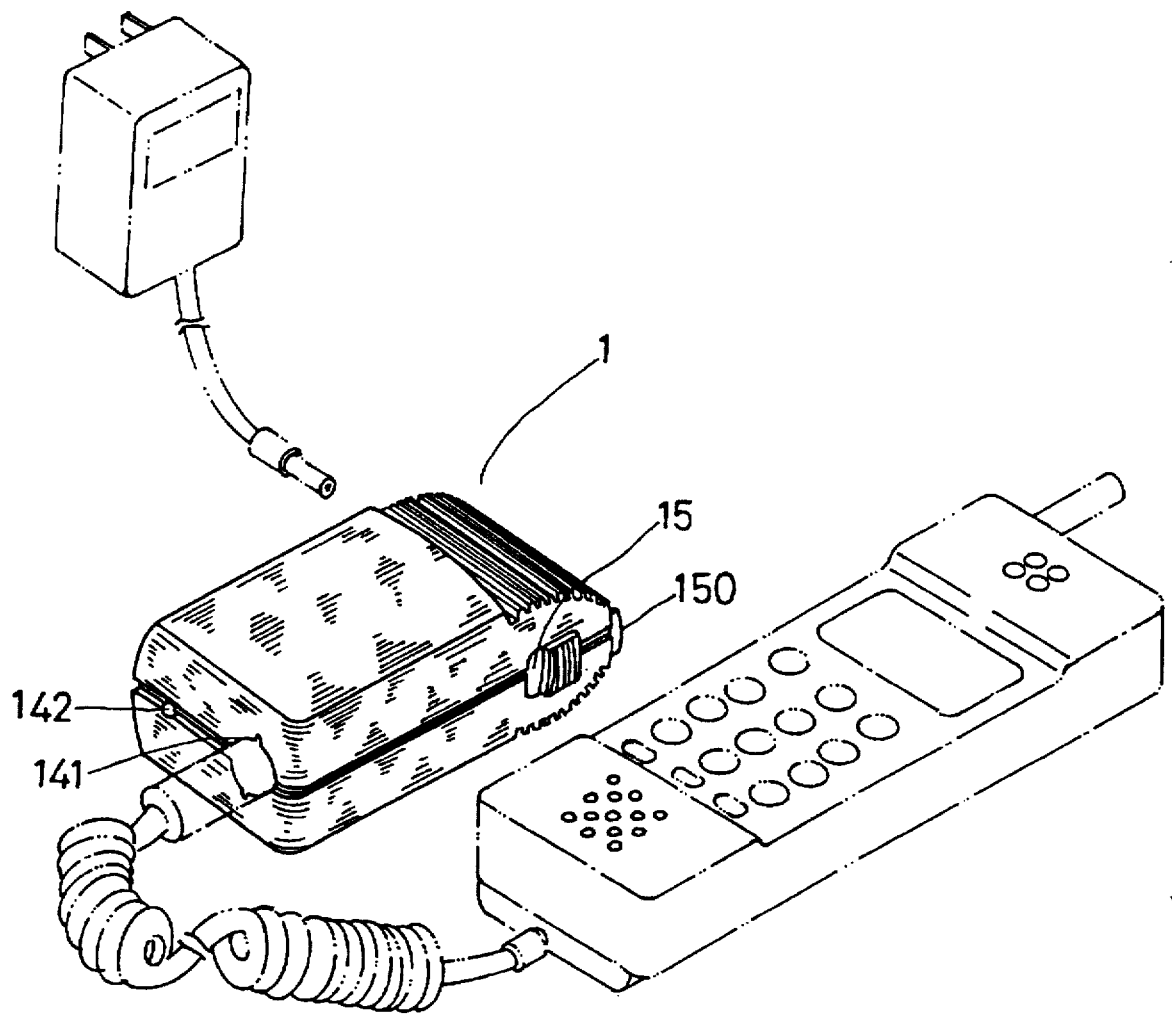
FIG. 9 is a perspective view of the preferred embodiment of a mobile telephone charger connected with a mobile telephone for charging.

Provided that the charger case 1 is only used without the plug 2 for charging AC current, referring to FIGS. 7, 8 and 9, the elastic plate hook 15 is pushed down manually, forcing the elastic means 152 to contract as shown in FIG. 7, letting the sloped edge 150 be retracted within the small chamber 12 as shown in FIG. 8 so that the plug 2 is no longer stopped by the plate hook 15, and can be pulled off the charger case 1, with the groove 271 separating from the plate hook 15. Then the input terminal 140 can be connected with a plug of an AC source for charging, as shown in FIG. 9.

Advantages of the invention can be understood from the above description as follows.

1. The components are simple, assembly is easy, and the arrangement is novel.

2. Its dimensions are small and is convenient to carry.

3. It can be adapted to either DC or AC.

While the preferred embodiment of the invention has been described above, it will be recognized and understood that various modifications may be made therein and the appended claims are intended to cover all such modifications which may fall within the spirit and scope of the invention.

What is claimed is:

1. A mobile telephone charger comprising:

a charger case consisting of a lower half case and an upper half case combined together, said charger case housing a circuit board fixed in said lower half case, said circuit board having an input terminal and an output terminal, a plurality of lateral slide grooves provided parallel in a partial outer surface of an end portion of said charger case;

a plug having a front tubular portion and a rear oval lid portion, said oval lid portion having a large opening at a left side and two opposite straight lengthwise edges defining said large opening, said two opposite straight lengthwise edges engaging and able to slide in said plurality of lateral slide grooves of said charger case, said front tubular portion having conducting means; and a rear end of said tubular portion being able to be connected with said input terminal of said circuit board fixed in said charger case, a front end of said tubular portion being able to be connected with a DC source of a cigarette lighter in an automobile, said output terminal of said charger case alternatively able to be connected with an AC adapter for connecting to a mobile telephone for charging said mobile telephone, and said charger case able to be connected directly with an AC source for charging said mobile telephone without using said plug.

2. The mobile telephone charger as claimed in claim 1, wherein said charger case has a small chamber at one corner for depositing an elastic plate hook, said plate hook has an upper sloped side edge to fit in a groove in an upper side of said oval lid portion of said plug so as to secure stably said plug with said charger case when said plug and said charger case are combined together.

3. The mobile telephone charger as claimed in claim 1, wherein said upper half case has a projecting post extending-down upright so as to contact and secure said circuit board in place in said charger case.

4. The mobile telephone charger as claimed in claim 1, wherein said circuit board in said charger case has a signal lamp on one corner so as to be lit up to show that said charger is in operating condition.

\* \* \* \* \*